(12) United States Patent
Yukawa

(10) Patent No.: US 6,320,267 B1
(45) Date of Patent: Nov. 20, 2001

(54) BONDING LAYER IN A SEMICONDUCTOR DEVICE

(75) Inventor: Masahiko Yukawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/369,282

(22) Filed: Aug. 6, 1999

(30) Foreign Application Priority Data

Aug. 10, 1998 (JP) ............................................... P10-226201

(51) Int. Cl.$^7$ ........................... H01L 23/48; H01L 25/52; H01L 29/40
(52) U.S. Cl. ........................ 257/783; 257/678; 257/693; 257/784; 257/701
(58) Field of Search ................................. 257/678, 783, 257/784, 789, 693, 675, 701, 708, 707; 438/122, 123, 128

(56) References Cited

U.S. PATENT DOCUMENTS

| 5,140,404 | * | 8/1992 | Fogal et al. | 257/678 |
| 5,157,478 | | 10/1992 | Ueda et al. | |
| 5,601,675 | * | 2/1997 | Hoffmeyer et al. | 156/94 |
| 6,111,308 | * | 8/2000 | Newman | 257/676 |

FOREIGN PATENT DOCUMENTS

| 0095918 A2 | 12/1983 | (EP) . | |
| 60066440 | 4/1985 | (JP) . | |
| 2-10757 | * 1/1990 | (JP) | 257/783 |

* cited by examiner

*Primary Examiner*—Jhihan B Clark
(74) *Attorney, Agent, or Firm*—Sonnenschein, Nath & Rosenthal

(57) ABSTRACT

A semiconductor chip is bonded on a radiator plate consisting of copper material with interposition of a bonding layer having a total thickness of 80 $\mu$m comprising a laminated structure including a thermoplastic film bonding layer 12a having a thickness of 50 $\mu$m and a paste-based bonding layer 12b having a thickness of 30 $\mu$m. For example, butadiene-modified polyolefin-based adhesive resin mixed with alumina fine power is used as material of the thermoplastic film bonding layer 12a, and, for example, silicone rubber-modified epoxy-based adhesive resin mixed with silver powder is used as material of the paste-based bonding layer 12b. There is thus provided a semiconductor device having a semiconductor chip bonded on a radiator plate with interposition of a bonding layer, wherein stress concentration caused in the bonding layer is relaxed and heat dissipation performance is maintained and thus the reliability in endurance is high, and a method for manufacturing the semiconductor device.

10 Claims, 1 Drawing Sheet

BONDING LAYER IN A SEMICONDUCTOR DEVICE

RELATED APPLICATION DATA

The present application claims priority to Japanese Application No. P10-226201 filed Aug. 10, 1998 which application is incorporated herein by reference to the extent permitted by law.

BACKGROUND OF THE INVENTION

1. Field of the Invention

This invention relates to a semiconductor device and a manufacturing method thereof and more particularly to a semiconductor device having a semiconductor chip bonded on a radiator plate with interposition of a bonding layer.

2. Description of the Related Art

It has been required that consumer appliances are made compact and the requirement has called for one chip structuring of a semiconductor device or high density mounting of a semiconductor device, and thus area array packages such as ball grid array, in which external connecting terminals are arranged in the form of two-dimensional area (referred to simply as "BGA" hereinafter), and land grid array (referred to simply as "LGA" hereinafter) have been proposed and practically used to satisfy the requirement for multi-pin semiconductor.

As a related area package, tape BGA (Tape-BFA, referred to simply as "T-BGA" hereinafter), in which TAB (Tape Automated Bonding) is used as interconnection technique, is described referring to FIG. 2.

For example, a semiconductor chip 44 is bonded on a radiator plate 40 consisting of copper material with interposition of a paste bonding layer 42. Many electrode pads 46 are formed on the surface of the semiconductor chip 44.

On the circumference of the radiator plate 40 surrounding the semiconductor chip 44, a stiffener 50 is bonded with interposition of a bonding layer 48. On the stiffener 50, many external connecting terminals 54 having a ball-shaped end respectively are arranged dispersedly in the form of array.

These many external connecting terminals 54 are connected to the electrode pads on the semiconductor chip 44 with interposition of respective inner leads 56. These many external connecting terminals 54 are covered with an insulating film 58 excepting the ball-shaped ends and insulated stably each other. As described herein above, the external connecting terminals 54, inner leads 56, and insulating film 58 constitute a wiring pattern 60 for connecting the electrode pads of the semiconductor chip 44 to the external.

The semiconductor chip 44 bonded on the radiator plate 40 with interposition of the paste bonding layer 42 and the inner leads 56 connected to the electrode pads 46 are covered with sealing resin 62, this is so-called resin sealing.

As described herein above, in the T-BGA, because many external connecting terminals 54 are arranged dispersedly in the form of array on the stiffener 50 surrounding the semiconductor chip 44, the package size of a T-BGA is made small even if the pitch of the external connecting terminals 54 of the semiconductor device having many pins is relatively large, for example, 1.0 mm or 0.27 mm, therefore this structure is effective for high density mounting.

Further, the semiconductor chip 44 is bonded directly on the radiator plate 40 with interposition of the paste bonding layer 42, and therefore heat generated from the semiconductor element during operation is easily dissipated, thus this structure is also effective for low heat resistance packaging.

However, in the above-mentioned T-BGA, the thermal expansion coefficient of the semiconductor chip 44 is approximately 3 ppm/° C. and the thermal expansion coefficient of the radiator plate 40 consisting of copper material is approximately 17 ppm/° C., the large difference in the thermal expansion coefficient between both components causes the stress concentration on the paste bonding layer 42 between the semiconductor chip 44 and the radiator plate 40, for example, when the semiconductor device is subjected to a thermal cycle test (referred to simply as T/C test hereinafter), in which the temperature of the T-BGA is varied cyclically, the bonding strength of the paste bonding layer 42 is decreased to cause cracking or separation occasionally at the end.

As described herein above, though the semiconductor device is excellent in heat dissipation initially as it is fabricated, after T/C test, the bonding strength of the paste bonding layer 42 which has been subjected to stress concentration is decreased, and good contact between the semiconductor chip 44 and the radiator plate 40 is deteriorated to result in significantly reduced heat dissipation, and thus the reliability in endurance becomes poor disadvantageously.

Not only T-BGA but also semiconductors of other types as long as a bonding layer is provided between a semiconductor chip and a radiator plate or a die pad consisting of copper material are involved generally in the problem.

SUMMARY OF THE INVENTION

The present invention has been accomplished to solve the above-mentioned problem, and the object of the present invention is to provide a semiconductor device having a semiconductor chip bonded on a radiator plate with interposition of a bonding layer in which stress concentration caused in the bonding layer is relaxed to maintain the heat dissipation performance and which is excellent in reliability in endurance and a method for manufacturing thereof.

The inventors of the present invention examined the reduction of stress concentration caused in a bonding layer between bonded bodies formed of different materials due to the difference in thermal expansion coefficient between these materials to solve the above-mentioned problem.

In general, sufficiently thick thickness of a bonding layer is required to relax stress concentration on the bonding layer to be provided between a semiconductor chip and a radiator plate which have the different thermal expansion coefficient each other. However, it is difficult to form an even bonding layer having a sufficient thickness with a single layer of a related paste-based bonding layer, and a bonding layer having the sufficiently thick thickness can not be realized.

To secure an even bonding layer having a thickness sufficient for the bonding layer to relax stress concentration caused on the bonding layer, the inventors tried to use a thermoplastic film bonding layer instead of paste-based bonding layer. In this case, though it was easily achieved to form an even bonding layer having a sufficient and necessary thickness, the bonding layer was involved in the problem of blistering in at least any one of interfaces between a semiconductor chip and the thermoplastic film bonding layer or a radiator plate and the thermoplastic film bonding layer when the thermoplastic film bonding layer placed between a semiconductor chip of a hard material and a radiator plate of a hard material was press-bonded together. In detail, though no blistering was not caused when a thermoplastic film bonding layer was bonded on a semiconductor chip or a radiator plate, however, it was very difficult to prevent blistering when a radiator plate or a semiconductor chip was press-bonded on the thermoplastic film bonding layer bonded on the semiconductor chip or the radiator plate. The existence of the blister resulted in reduced bonding strength and reduced heat dissipation performance of the bonding layer.

Experiments were repeated to find a bonding layer for forming an even bonding layer having a necessary and sufficient thickness to relax stress concentration by a method in which blistering was prevented so as not to cause reduction of bonding strength and reduction of heat dissipation performance. As the result, the semiconductor device and the method for manufacturing thereof in accordance with the present invention has been accomplished.

In detail, a semiconductor device in accordance with one aspect of the present invention is a semiconductor device having a semiconductor chip bonded on a radiator plate with interposition of a bonding layer, wherein the bonding layer comprises a laminated structure including a thermoplastic film bonding layer and a paste-based bonding layer.

In the semiconductor device in accordance with one aspect of the present invention, because the laminated structure including the thermoplastic film bonding layer and the paste-based bonding layer is employed as the bonding layer for bonding the semiconductor chip on the radiator plate, an even bonding layer having a necessary and sufficient thickness is formed, and blistering, which causes reduction of bonding strength and reduction of heat dissipation of the bonding layer, is prevented.

In other words, the thermoplastic film bonding layer is served to secure the necessary and sufficient thickness of the bonding layer and to secure the evenness of the bonding layer, and on the other hand, the paste-based bonding layer formed of soft material which is provided on the one side of the thermoplastic film bonding layer is served to prevent blistering when the bonding layer is press-bonded together with the thermoplastic film bonding layer.

The semiconductor device in accordance with another aspect of the present invention is a semiconductor device described in the above-mentioned claim 1, wherein the total thickness of the thermoplastic film bonding layer and the paste-based bonding layer is in a range from 50 to 150 $\mu$m, and the stress concentration suppression effect is thereby improved while the heat dissipation effect of the bonding layer having the two layer structure is maintained.

In detail, the total thickness of the thermoplastic film bonding layer and the paste-based bonding layer thinner than 50 $\mu$m results in reduced stress concentration suppression effect on the bonding layer having the two layer structure though the heat dissipation effect is improved, for example, the excellent contact between the semiconductor chip and the radiator plate is deteriorated and the heat dissipation performance is decreased after T/C testing, and the reliability in endurance therefore becomes poor. On the other hand, the total thickness of the thermoplastic film bonding layer and the paste-based bonding layer thicker than 150 $\mu$m results in reduced heat dissipation effect though the stress concentration suppression effect on the bonding layer having the two layer structure is improved. Accordingly, the total thickness of the thermoplastic film bonding layer and the paste-based bonding layer of 50 to 150 $\mu$m is preferable to improve the stress concentration suppression effect while the heat dissipation effect of the bonding layer having the two layer structure is improved.

The thickness of the thermoplastic film bonding layer is preferably in a range form 20 to 100 $\mu$m and the thickness of the paste-based bonding layer is preferably in a range from 10 to 70 $\mu$m while the total thickness of the bonding layer having the two layer structure is in a range from 50 to 150 $\mu$m.

The semiconductor device in accordance with another aspect of the present invention is a semiconductor described in the above-mentioned claim 1, wherein the thermoplastic film bonding layer is modified or blended with rubber-based material. For example, polyolefin-based or polyimide-based thermoplastic resin is modified or blended with silicone rubber, butadiene rubber, urethane rubber, or acrylic rubber, and the film-like thermoplastic resin bonding layer is thereby rendered soft and low in the elastic modulus, thus the larger stress concentration relaxation effect is brought about with the thinner thickness. Particularly the thermoplastic film bonding layer having the elastic modulus of 1 GPa or lower at a room temperature and the elastic modulus of 3 GPa or lower at −25° C. is more effective in stress concentration suppression.

The semiconductor device in accordance with another aspect of the present invention is a semiconductor described in the above-mentioned claim 1, wherein ceramic fine powder or metal powder is mixed in the thermoplastic film bonding layer. The ceramic fine powder or metal power is served to improve the thermal conductivity of the thermoplastic film bonding layer, and thereby brings about the more improved heat dissipation performance. Examples of ceramic fine powder include, for example, fine powder of alumina, silica, and silicon nitride, and examples of metal powder include, for example, silver powder and aluminum powder.

Further, the semiconductor device in accordance with another aspect of the present invention is the above-mentioned semiconductor, wherein the paste-based bonding layer is mixed with fine powder filler. For example, the fine powder filler such as silver powder or silica powder is mixed in epoxy resin or silicone resin, and thereby improves the bonding strength and thermal conductivity of the paste-based bonding layer.

Further, the semiconductor device in accordance with another aspect of the present invention is a semiconductor device described above, wherein the paste-based bonding layer is formed of epoxy-based adhesive resin, and the epoxy-based adhesive resin is modified or blended with rubber-based material. For example, epoxy-based adhesive resin is modified or blended with silicone rubber, butadiene rubber, urethane rubber, or acrylic rubber, then the elastic modulus is thereby reduced, and such epoxy-based adhesive resin exhibits the more stress concentration relaxation effect with the thinner thickness. Particularly, the paste-based bonding layer having an elastic modulus of 1 GPa or lower at a room temperature exhibits the marked stress concentration relaxation effect.

Further, a method for manufacturing a semiconductor device in accordance with another aspect of the present invention comprises a step for coating a paste-based bonding layer on the back side of the semiconductor chip, a step for bonding a thermoplastic film bonding layer on a radiator plate, and a step for heat-press-bonding the paste-based bonding layer coated on the back side of the semiconductor chip and the thermoplastic film bonding layer bonded on the radiator plate together.

In the method for manufacturing a semiconductor device in accordance with another aspect of the present invention as described herein above, the paste-based bonding layer coated on the back side of the semiconductor chip and the thermoplastic film bonding layer bonded on the radiator plate are heat-press-bonded together to thereby form an even bonding layer having a necessary and sufficient thickness comprising the laminated structure including the thermoplastic film bonding layer and the paste-based bonding layer. In this case, blistering, which causes reduction of bonding strength and reduction of heat dissipation performance of the bonding layer, is prevented because the thermoplastic film bonding layer is bonded on the radiator plate and then the exposed side is heat-press-bonded to the paste-based bonding layer of soft material, differently from the case that the bonding layer is placed directly between the semiconductor chip and the radiator plate of hard material and press-bonded together.

A method for manufacturing a semiconductor device in accordance with another aspect of the present invention comprises a step for bonding a thermoplastic film bonding layer on a radiator plate, a step for coating a paste-based bonding layer on the thermoplastic film bonding layer, and a step for press-bonding the semiconductor chip on the paste-based bonding layer.

In the method for manufacturing a semiconductor in accordance with another aspect of the present invention, as described herein above, the paste-based bonding layer is bonded on the thermoplastic film bonding layer bonded on the radiator plate to thereby form an even bonding layer having a necessary and sufficient thickness comprising the laminated structure including the thermoplastic film bonding layer and the paste-based bonding layer. Because the paste bonding layer of soft material is coated on the exposed surface of the thermoplastic film bonding layer after the thermoplastic film bonding layer has been bonded on the radiator plate, blistering, which causes reduction of bonding strength and reduction of heat dissipation performance of the bonding layer, is prevented, diffidently from the case that the bonding layer is placed directly between the semiconductor chip and the radiator plate of hard material and then press-bonded together.

DETAILED DESCRIPTION OF THE PREFERRED EMBODIMENTS

The embodiment of the present invention will be described in detail hereinafter with reference to the attached drawings.

Figure 1:
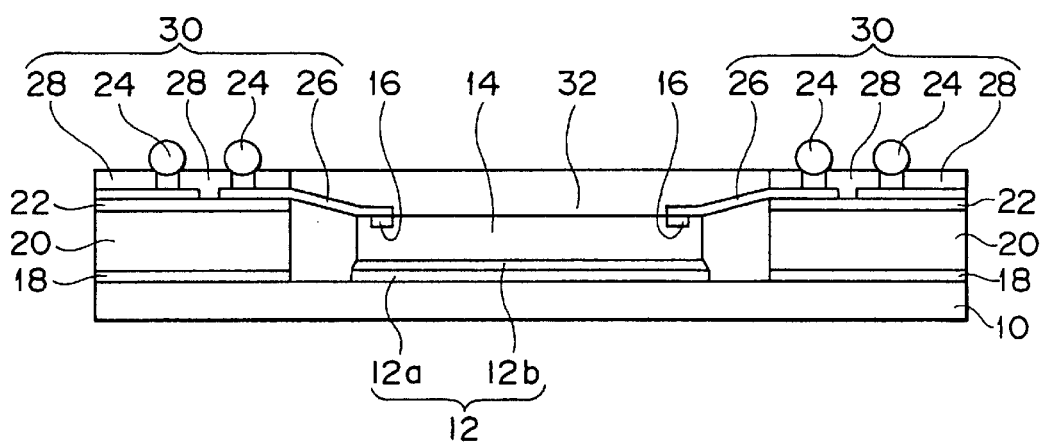
FIG. 1 is a schematic cross sectional view for illustrating T-BGA in accordance with one embodiment of the present invention.

FIG. 1 is a schematic cross sectional view for illustrating a T-BGA in accordance with one embodiment of the present invention.

A semiconductor chip 14 is bonded on a radiator plate 10 consisting of, for example, copper material with interposition of a bonding layer 12 having a total thickness of 80 $\mu$m comprising two layer structure of a thermoplastic film bonding layer 12a having a thickness of 50 $\mu$m and a paste bonding layer 12b having a thickness of 30 $\mu$m. A plurality of electrode pads 16 are formed on the surface of the semiconductor chip 14. For example, a polyolefin-based adhesive resin modified with butadiene rubber mixed with alumina fine powder is used as the material of the thermoplastic film bonding layer 12a, and, for example, a epoxy-based adhesive resin modified with silicone rubber mixed with silver powder is used as the material of the paste-based bonding layer 12b.

A stiffener 20 is bonded on the radiator plate 10 surrounding the semiconductor chip 14 with interposition of a bonding layer 18. A plurality of external connecting terminals 24 having a ball-shaped end are arranged dispersedly in the form of array on the stiffener 20 with interposition of a bonding layer 22.

The plurality of external connecting terminals 24 are connected to the electrode pads 16 provided on the surface of the semiconductor chip 14 with interposition of respective inner leads 26. The plurality of external connecting terminals 24 are covered with an insulating film 28 excepting the ball-shaped ends, and are insulated stably each other. The plurality of external connecting terminals 24 having a ball-shaped end, inner leads 26 connected to the respective external connecting terminals 24, and the insulating film 28 which covers these external connecting terminals 24 excepting the ball-shaped ends constitute a wiring pattern 30 for connecting the electrode pads 16 of the semiconductor 14 to the external.

The semiconductor chip 14, which is bonded on the radiator plate 10 with interposition of the bonding layer 12 comprising the laminated structure including the thermoplastic film bonding layer 12a and the paste bonding layer 12b, and the inner leads 26 connected to the respective electrode pads 16 are covered with the sealing resin 32 and resin sealed.

Next, the first fabrication process of the T-BGA is described.

First, the wiring pattern 30 comprising the plurality of external connecting terminals 24 having a ball-shaped end, the inner leads 26 connected to the respective external connecting terminals 24, and the insulating film 28, which covers the respective connecting terminals 24 excepting ball-shaped ends, is heat-press-bonded on the stiffener 20 with interposition of the bonding layer 22. The plurality of external connecting terminals 24 having a ball-shaped end are arranged dispersedly in the form of array on the stiffener 20 as described herein above.

Next, the semiconductor chip 14 is bonded on the radiator plate 10 consisting of copper material at a predetermined position with interposition of the bonding layer 12 comprising the laminated structure including the thermoplastic film bonding layer 12a and the paste-based bonding layer 12b. In this case, two methods are employable.

In one method of the two, the paste-based bonding layer 12b consisting of epoxy-based adhesive resin modified with silicone rubber having a thickness of 30 $\mu$m is coated on the back side of the semiconductor chip 14. Further, the thermoplastic film bonding layer 12a consisting of polyolefin-based adhesive resin modified with butadiene rubber having a thickness of 50 $\mu$m is bonded on the radiator plate 10 at a predetermined position. Subsequently, the paste-based bonding layer 12b coated on the-based side of the semiconductor 14 and the thermoplastic film bonding layer 12a bonded on the radiator plate 10 are heat-press-bonded together.

In the other method of the two, the thermoplastic film bonding layer 12a consisting of polyolefin-based adhesive resin modified with butadiene rubber having a thickness of 50 $\mu$m is bonded on the radiator plate 10 at a predetermined position. Subsequently, the paste-based bonding layer 12b consisting of epoxy-based adhesive resin modified with silicone rubber having a thickness of 30 μm is coated on the thermoplastic film bonding layer 12a. Further, the semiconductor chip 14 is press-bonded on the paste-based bonding layer 12b.

Next, the stiffener 20 on which the wiring pattern 30 has been press-bonded is aligned and then bonded on the radiator plate 10 surrounding the semiconductor chip 14 with interposition of the bonding layer 18. Subsequently, the inner leads 26 of the wiring pattern 30 are connected to the electrode pads 16 on the surface of the semiconductor chip 14. As described herein above, the electrode pads 16 on the surface of the semiconductor chip 14 are connected to the external connecting terminals 24 by way of the inner leads 26 by inner lead bonding.

Next, the semiconductor chip 14 bonded on the radiator plate 10 with interposition of the bonding layer 12 comprising the laminated structure including the thermoplastic film bonding layer 12a and the paste-based bonding layer 12b and the inner leads 26 connected to the respective electrode pads 16 are covered with the sealing resin 32 and resin sealed. Thus the T-BGA shown in FIG. 1 is fabricated.

Next, the second fabrication method of T-BGA shown in FIG. 1 is described.

First, the wiring pattern 30 comprising the plurality of external connecting terminals 24 having a ball-shaped end, the inner leads 26 connected to the respective external connecting terminals 24, and the insulating film 28, which covers the respective connecting terminals 24 excepting ball-shaped ends, is press-bonded on the stiffener 20 with interposition of the bonding layer 22. The plurality of external connecting terminals 24 having a ball-shaped end are arranged dispersedly in the form of array on the stiffener 20 as described herein above.

Next, the inner leads 26 of the wiring pattern 30 which is press-bonded on the stiffener 20 is connected to the electrode pads 16 on the surface of the semiconductor chip 14 by inner lead bonding. As described herein above, the electrode pads 16 on the surface of the semiconductor chip 14 are connected to the respective external connecting terminals 24 by way of the respective inner leads 26.

Next, the semiconductor chip 14 is bonded on the radiator plate 10 at a predetermined position with interposition of the bonding layer 12 comprising the laminated structure including the thermoplastic film bonding layer 12a and the paste-based bonding layer 12b, and the stiffener 20 is bonded on the radiator plate 10 surrounding the semiconductor chip 14 with interposition of the bonding layer 18. Two methods are employable also in this case.

In one method, the paste-based bonding layer 12b consisting of epoxy-based adhesive resin modified with silicone rubber having a thickness of 30 μm is coated on the back side of the semiconductor chip 14. The thermoplastic film bonding layer 12a consisting of polyolefin-based modified with butadiene rubber having a thickness of 50 μm is bonded on the radiator plate 10 at the position where the semiconductor chip 14 is to be mounted, and the bonding layer 18 is coated on the radiator plate 10 surrounding the place where the semiconductor chip 14 is to be mounted. Subsequently, the paste-based bonding layer 12b coated on the back side of the semiconductor chip 14 and the thermoplastic film bonding layer 12a bonded on the radiator plate 10 are heat-press-bonded together, and the stiffener 20 is press-bonded on the bonding layer 18 coated on the radiator plate 10.

In the other method, the thermoplastic film bonding layer 12a consisting of polyolefin-based adhesive resin modified with butadiene having a thickness of 50 μm is bonded on the radiator plate 10 at the place where the semiconductor chip 14 is to be mounted. Subsequently, the paste-based bonding layer 12b consisting of epoxy-based adhesive resin modified with silicone rubber having a thickness of 30 μm is coated on the thermoplastic film bonding layer 12a. The semiconductor chip 14 is thereafter press-bonded on the paste-based bonding layer 12b coated on the thermoplastic film bonding layer 12a, and the stiffener 20 is press-bonded on the bonding layer 18 coated on the radiator plate 10.

Next, the semiconductor chip 14 bonded on the radiator plate 10 with interposition of the bonding layer 12 comprising the laminated structure including the thermoplastic film bonding layer 12a and the paste-based bonding layer 12b and the inner leads 26 connected to the respective electrode pads of the semiconductor chip 14 are covered with the sealing resin 32 and resin sealed. Thus the T-BGA shown in FIG. 1 is fabricated.

Next, the T/C test result on the T-BGA in accordance with the present embodiment shown in FIG. 1 is described.

In the T/C test, the high temperature side temperature was set to 125° C. and the low temperature side temperature was set to −55° C. Four sets of conditions for thermal cycling namely the number of cycles of 200, 400, 600, and 1000 were used. Ten test T-BGAs shown in FIG. 1 were fabricated and these Ten T-BGAs were subjected to the test. For comparison, Ten related T-BGAs as shown in FIG. 2 were fabricated and these related 10 T-BGAs were also subjected to the same T/C test.

Figure 2:
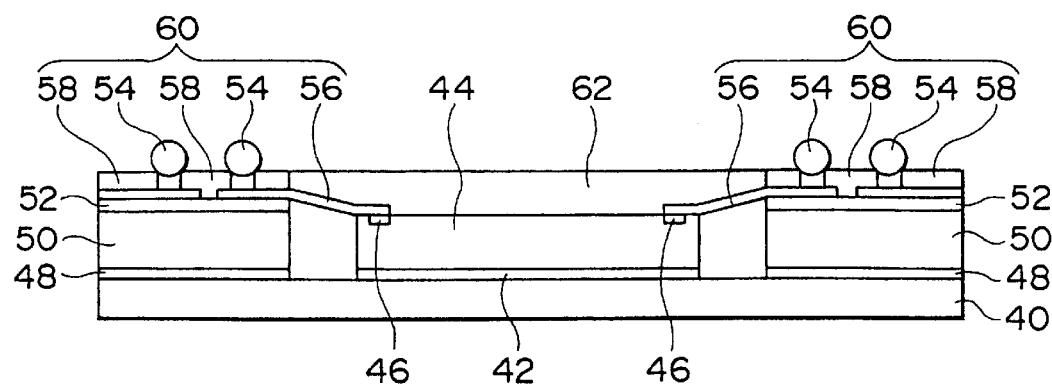
FIG. 2 is a schematic cross sectional view for illustrating the related T-BGA.

The number of defectives caused in the laminated structure including the thermoplastic film bonding layer 12a and the paste-based bonding layer 12b of the T-BGAs in accordance with the present embodiment shown in FIG. 1 and the number of defectives caused in the paste-based bonding layer 42 of the related T-BGAs shown in FIG. 2 in the T/C test are shown in Table 1.

TABLE 1

| | The number of defectives | | | |
| --- | --- | --- | --- | --- |
| | Thermal cycles | | | |
| | 200 | 400 | 600 | 1000 |
| T-BGA according to the present embodiment | 0/10 | 0/10 | 0/10 | 0/10 |
| Related T-BGA | 0/10 | 2/10 | 10/10 | — |

As obviously shown in the T/C test result in Table 1, zero test piece out of 10 T-BGA in accordance with the present invention shown in FIG. 1 are defective due to cracking or separation in the bonding layer 12 comprising laminated structure including the thermoplastic film bonding layer 12a and the paste-based bonding layer 12b after 1000 repeated thermal cycles, that is, no defective was caused.

On the other hand, in the case of the related T-BGAs shown in FIG. 2, though no defect was caused after 200 repeated thermal cycles, two defectives were caused after 400 repeated thermal cycles, and 10 defectives were caused after 600 repeated thermal cycles, that is, all the test pieces were defective.

As described herein above, according to the present embodiment, by heat-press-bonding the paste-based bonding layer 12b consisting of soft material having a thickness of 30 μm coated on the back side of the semiconductor chip 14 and the thermoplastic film bonding layer 12a having a thickness of 50 μm bonded on the radiator plate 10 together or by press-bonding the semiconductor chip 14 on the paste-based bonding layer 12b having a thickness of 30 μm which has been formed by coating soft paste-based bonding material on the thermoplastic film bonding layer 12a having a thickness of 50 μm bonded on the radiator plate 10, the bonding layer 12 comprising the laminated structure including a total thickness of 80 μm, which satisfies the necessary and sufficient condition, is formed evenly, and blistering which will cause reduction of bonding strength of the bonding layer and reduction of heat dissipation is prevented, the bonding structure described herein above is effective to relax stress concentration caused in the bonding layer 12 comprising the two layer structure and to maintain excellent heat dissipation performance, and thus high reliability in endurance is realized.

In the above-mentioned embodiment, the bonding layer 12 comprising the laminated structure including the thermoplastic film bonding layer 12a and the paste-based bonding layer 12b having a total thickness of 80 μm is used, however the total thickness of the bonding layer 12 comprising the two layer thickness is by no means limited to this value, for example, any bonding layer 12 may be used to improve the stress concentration preventing effect while maintaining the heat dissipating effect on the bonding layer 12 comprising the two layer structure as long as the total thickness is, for example, in a range from 50 μm to 150 μm.

The bonding layer 12 exhibits the maximized stress concentration relaxing effect with a thinner thickness by employing polyolefin-based adhesive resin modified with butadiene rubber as the material of the thermoplastic film bonding layer 12a to form the bonding layer of a soft thermoplastic resin film by using polyolefin-based adhesive resin modified with butadiene rubber as the material of the thermoplastic film bonding layer 12a so that the bonding layer is formed of soft thermoplastic film resin having low elastic modulus. Further, polyolefin-based adhesive resin modified with butadiene rubber contains alumina fine powder so that the thermal conductivity is increased and the heat dissipation performance is improved.

In the above-mentioned present embodiment, the thermoplastic resin of polyolefin-based adhesive resin was used as the material of the thermoplastic film bonding layer 12a, however the material of the thermoplastic film bonding layer 12a is no by means limited to this resin, for example, other thermoplastic resin such as polyimide may be used. The thermoplastic resin which is modified with butadiene rubber is used in the above-mentioned present embodiment, however other polymers such as silicone rubber, urethane rubber, or acrylic rubber may be used for modification or blending. Further, fine powder of ceramics such as silica or silicon nitride, or metal fine power such as silver power or aluminum powder may be mixed instead of alumina fine powder.

The bonding strength and thermal conductivity of the paste-based bonding layer 12b are increased by using epoxy-based adhesive resin mixed with silver powder as the material of the paste-based bonding layer 12b. Because the elastic modulus is decreased by modifying epoxy-based adhesive resin with silicone rubber, the bonding layer exhibits significant stress concentration relaxing effect with a thinner thickness.

In the above-mentioned embodiment, epoxy-based adhesive resin mixed with silver powder is used as the material of the paste-based bonding layer 12b, however the material of the paste-based bonding layer 12b is by no means limited to this resin, for example, silicone-based adhesive resin may be used instead of epoxy-based adhesive resin. Further, fine powder filler such as silica powder or alumina powder may be used instead of silver powder. Epoxy-based adhesive resin is modified with silicone rubber in the above-mentioned embodiment, however for example, butadiene rubber, urethane rubber, or acrylic rubber may be used for modification or blending.

As described herein above, according to the semiconductor device and the fabrication method thereof in accordance with the present invention, the present invention exhibits the following effects.

In detail, according to the semiconductor device in accordance with the claim 1, because the laminated structure including the thermoplastic film bonding layer and the paste-based bonding layer is employed as the bonding layer for bonding the semiconductor chip on the radiator plate, an even bonding layer having a necessary and sufficient thickness is formed, and blistering, which causes reduction of bonding strength and reduction of heat dissipation of the bonding layer, is prevented, further the stress concentration caused in the bonding layer is relaxed while the heat dissipation performance is maintained, and thus high reliability in endurance is obtained.

According to the semiconductor device in accordance with claim 2, the total thickness of the thermoplastic film bonding layer and the paste-based bonding layer is in a range from 50 to 150 μm, and the stress concentration suppression effect is thereby improved while the heat dissipation effect of the bonding layer having the two layer structure is maintained.

According to the semiconductor device in accordance with claim 3, the thermoplastic film bonding layer is modified or blended with rubber-based material. and the film-like thermoplastic resin bonding layer is thereby rendered soft and low in the elastic modulus, thus the larger stress concentration relaxation effect is brought about with the thinner thickness.

According to the semiconductor device in accordance with claim 4, ceramic fine powder or metal powder is mixed in the thermoplastic film bonding layer. The ceramic fine powder or metal power is served to improve the thermal conductivity of the thermoplastic film bonding layer, and thereby brings about the more improved heat dissipation performance.

According to the semiconductor device in accordance with claim 5, the paste-based bonding layer is mixed with fine powder filler, and thereby improves the bonding strength and thermal conductivity of the paste-based bonding layer.

According to the semiconductor device in accordance with claim 6, the epoxy-based adhesive resin is modified or blended with rubber-based material, the elastic modulus is thereby reduced, and such epoxy-based adhesive resin exhibits the more stress concentration relaxation effect with the thinner thickness.

According the method for manufacturing a semiconductor device in accordance with claim 7, the paste-based bonding layer coated on the back side of the semiconductor chip and the thermoplastic film bonding layer bonded on the radiator plate are heat-press-bonded together to thereby form an even bonding layer having a necessary and sufficient thickness comprising the laminated structure including the thermoplastic film bonding layer and the paste-based bonding layer. Further, blistering, which causes reduction of bonding strength and reduction of heat dissipation performance of the bonding layer, is prevented because the thermoplastic film bonding layer is bonded on the radiator plate and then the exposed side is heat-press-bonded on the paste-based bonding layer of soft material.

According to the method for manufacturing a semiconductor device in accordance with claim 8, the paste-based bonding layer is bonded on the thermoplastic film bonding layer bonded on the radiator plate to thereby form an even bonding layer having a necessary and sufficient thickness comprising the laminated structure including the thermoplastic film bonding layer and the paste-based bonding layer. Further, because the paste bonding layer of soft material is coated on the exposed surface of the thermoplastic film bonding layer after the thermoplastic film bonding layer has been bonded on the radiator plate, blistering, which causes reduction of bonding strength and reduction of heat dissipation performance of the bonding layer, is prevented,

What is claimed is:

1. A semiconductor device, comprising:
   a radiator plate; and
   a semiconductor chip bonded on the radiator plate by a bonding layer, wherein the bonding layer includes a laminated structure having a thermoplastic film bonding layer and a paste-based bonding layer.

2. A semiconductor device as claimed in claim 1, wherein the total thickness of the thermoplastic film bonding layer and the paste-based bonding layer is 50 to 150 $\mu$m.

3. A semiconductor device as claimed in claim 1, wherein the thermoplastic film bonding layer is modified with a rubber-based material.

4. A semiconductor device as claimed in claim 1, wherein the thermoplastic film bonding layer is mixed with one of ceramic fine powder and metal powder.

5. A semiconductor device as claimed in claim 1, wherein the paste-based bonding layer includes a resin mixed with fine powder filler.

6. A semiconductor device as claimed in claim 2, wherein a ratio of a thickness of the thermoplastic film bonding layer to a thickness of the paste-based bonding layer is 5 to 3.

7. A semiconductor device as claimed in claim 1, wherein a stack is structurally arranged in the following order
   (i) the semiconductor chip,
   (ii) the paste-based bonding layer,
   (iii) the thermoplastic film bonding layer, and
   (iv) the radiator plate.

8. A semiconductor device as claimed in claim 1, wherein a width of the paste-based bonding layer tapers from a width of the thermoplastic film bonding layer to a width of the semiconductor chip.

9. A semiconductor device as claimed in claim 5, wherein the paste-based bonding layer is formed of epoxy-based adhesive resin, and the epoxy-based adhesive resin is modified with a rubber-based material.

10. A semiconductor device as claimed in claim 9, wherein the thickness of the thermoplastic film bonding layer is 50 $\mu$m and the thickness of the paste-based bonding layer is 30 $\mu$m.

* * * * *